(12) United States Patent
Le et al.

(10) Patent No.: US 10,447,227 B2
(45) Date of Patent: Oct. 15, 2019

(54) RADIO FREQUENCY TRANSCEIVER CIRCUIT WITH DISTRIBUTED INDUCTOR AND METHOD THEREOF

(71) Applicant: Beken Corporation, Shanghai (CN)

(72) Inventors: Guogen Le, Shanghai (CN); Qunshan Xu, Shanghai (CN)

(73) Assignee: Beken Corporation, Shanghai (CN)

( * ) Notice: Subject to any disclaimer, the term of this patent is extended or adjusted under 35 U.S.C. 154(b) by 45 days.

(21) Appl. No.: 15/877,348

(22) Filed: Jan. 22, 2018

(65) Prior Publication Data
US 2019/0214960 A1    Jul. 11, 2019

(30) Foreign Application Priority Data
Jan. 5, 2018  (CN) .......................... 2018 1 0011487

(51) Int. Cl.
| | | |
|---|---|---|
| *H03H 7/01* | (2006.01) | |
| *H01P 3/08* | (2006.01) | |
| *H03H 7/38* | (2006.01) | |
| *H05K 1/02* | (2006.01) | |
| *H05K 1/16* | (2006.01) | |

(52) U.S. Cl.
CPC ........... *H03H 7/0115* (2013.01); *H01P 3/081* (2013.01); *H03H 7/0161* (2013.01); *H03H 7/38* (2013.01); *H05K 1/0298* (2013.01); *H05K 1/162* (2013.01)

(58) Field of Classification Search
CPC ...... H03H 7/0115; H03H 7/0161; H03H 7/38; H01P 3/081; H05K 1/0298; H05K 1/162

USPC ......................................................... 333/124
See application file for complete search history.

(56) References Cited

U.S. PATENT DOCUMENTS

| | | | | |
|---|---|---|---|---|
| 6,064,281 A | * | 5/2000 | Sheen .................. | H03H 7/0123 333/134 |
| 6,952,142 B2 | * | 10/2005 | Guitton .................... | H03H 7/42 333/177 |

* cited by examiner

*Primary Examiner* — Stephen E. Jones
*Assistant Examiner* — Samuel S Outten
(74) *Attorney, Agent, or Firm* — Schwegman Lundberg & Woessner, P.A.

(57) ABSTRACT

A radio-frequency transceiver circuit, comprising: a first port and a second port, configured to receive, together, a pair of differential signals; a radio-frequency matching circuit communicatively coupled to the first port and the second port, and configured to process the pair of differential signals to obtain a radio-frequency signal and configured to increase transmission power for the radio-frequency signal, wherein the radio-frequency matching circuit includes at least one capacitor, at least one distributed inductor; a band pass filter circuit, communicatively coupled to the radio-frequency matching circuit and configured to filter the radio-frequency signal, wherein the band pass filter circuit includes at least one capacitor and at least one distributed inductor; and a third port, communicatively coupled to the band pass filter circuit and configured to output the filtered radio-frequency signal, wherein both of the at least one distributed inductors have a length of microstrip line.

8 Claims, 5 Drawing Sheets

US 10,447,227 B2

RADIO FREQUENCY TRANSCEIVER CIRCUIT WITH DISTRIBUTED INDUCTOR AND METHOD THEREOF

CLAIM OF PRIORITY

This application claims priority to Chinese Application No. 201810011487.1 entitled "RADIO FREQUENCY TRANSCEIVER CIRCUIT WITH DISTRIBUTED INDUCTOR AND METHOD THEREOF," filed on Jan. 5, 2018 by Beken Corporation, which is incorporated herein by reference.

TECHNICAL FIELD

The present application relates to circuits, and more particularly but not exclusively to a radio frequency (RF) transceiver circuit with distributed inductors.

BACKGROUND

A conventional RF circuit usually uses a discrete inductor as one of the electronic elements constituting the circuit. However, the product cost of the discrete inductor is relatively high and the utilization of the discrete inductor always affects the consistency of product performance of the printed circuit board (PCB).

To solve the above problems, a radio frequency transceiver circuit with distributed inductors may be necessary.

SUMMARY OF THE INVENTION

In an embodiment, a radio-frequency transceiver circuit comprises a first port and a second port, configured to, together, receive a pair of differential signals; a radio-frequency matching circuit, communicatively coupled to the first port and the second port, and configured to process the pair of differential signals to obtain a radio-frequency signal and increase transmission power for the radio-frequency signal, wherein the radio-frequency matching circuit includes at least one capacitor and at least one distributed inductor; a band pass filter circuit, communicatively coupled to the radio-frequency matching circuit and configured to filter the radio-frequency signal, wherein the band pass filter circuit includes at least one capacitor and at least one distributed inductor; and a third port, communicatively coupled to the band pass filter circuit and configured to output the filtered radio-frequency signal, wherein both of the at least one distributed inductors have a length of microstrip line.

Another embodiment discloses a method in the radio-frequency transceiver circuit comprises: receiving a pair of differential signals via a first port and a second port; processing, with a radio-frequency matching circuit, the pair of differential signals to obtain a radio-frequency signal and increasing transmission power for the radio-frequency signal, wherein the radio-frequency matching circuit is communicatively coupled to the first port and the second port and includes at least one capacitor and at least one distributed inductor; filtering, with a band pass filter circuit, the radio-frequency signal, wherein the band pass filter circuit is communicatively coupled to the radio-frequency matching circuit and includes at least one capacitor and at least one distributed inductor; and outputting the filtered radio-frequency signal via a third port, wherein the third port is communicatively coupled to the band pass filter circuit, and wherein both of the at least one distributed inductors have a length of microstrip line.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
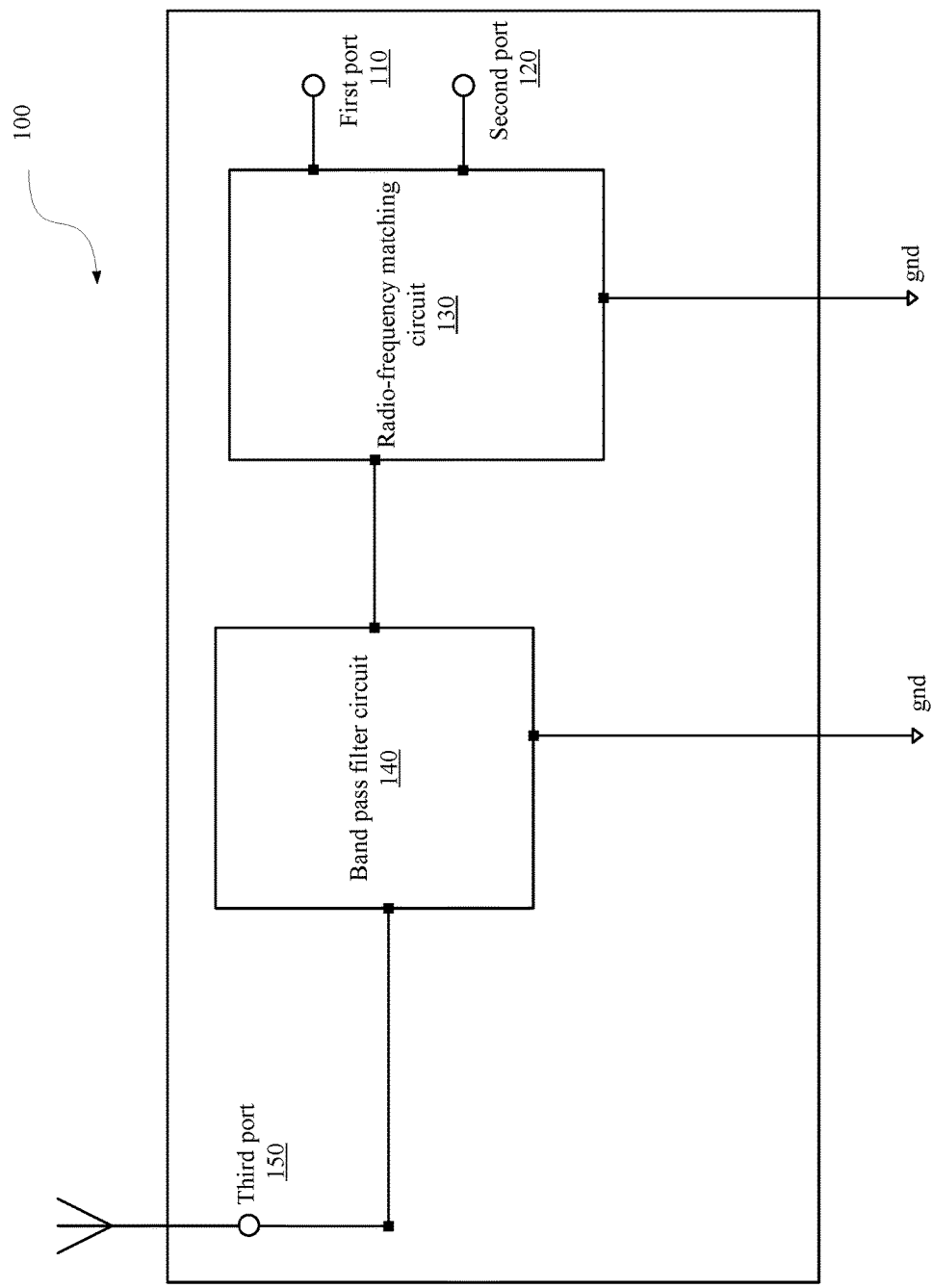
FIG. 1 is a block diagram illustrating an embodiment of a radio frequency (RF) circuit.

FIG. 1 is a block diagram illustrating an embodiment of a radio frequency (RF) circuit 100. The RF circuit 100 comprises a first port 110, a second port 120, a radio-frequency matching circuit 130, a band pass filter circuit 140 and a third port 150. In an embodiment, the first port 110 and the second port 120 are configured to, together, receive a pair of differential signals. Then the radio-frequency matching circuit 130 is communicatively coupled to both the first port and the second port. The circuit 130 is configured to process the pair of differential signals to obtain a RF signal and to increase transmission power for the radio-frequency signal. In the embodiment, the RF matching circuit 130 comprises at least one capacitor and at least one distributed inductor. Wherein the at least one distributed inductor has a length of microstrip line. Still in the embodiment, the band pass filter circuit 140 is communicatively coupled to the radio-frequency matching circuit 130 and the circuit 140 is configured to filter the RF signal. Wherein the band pass filter circuit 140 comprises at least one capacitor and at least one distributed inductor and wherein the at least one distributed inductor has a length of microstrip line. The filtered RF signal is outputted via the third port 150, which is communicatively coupled to the band pass filter circuit 140 and then transmitted by an antenna communicatively coupled to the third port 150.

Figure 2:
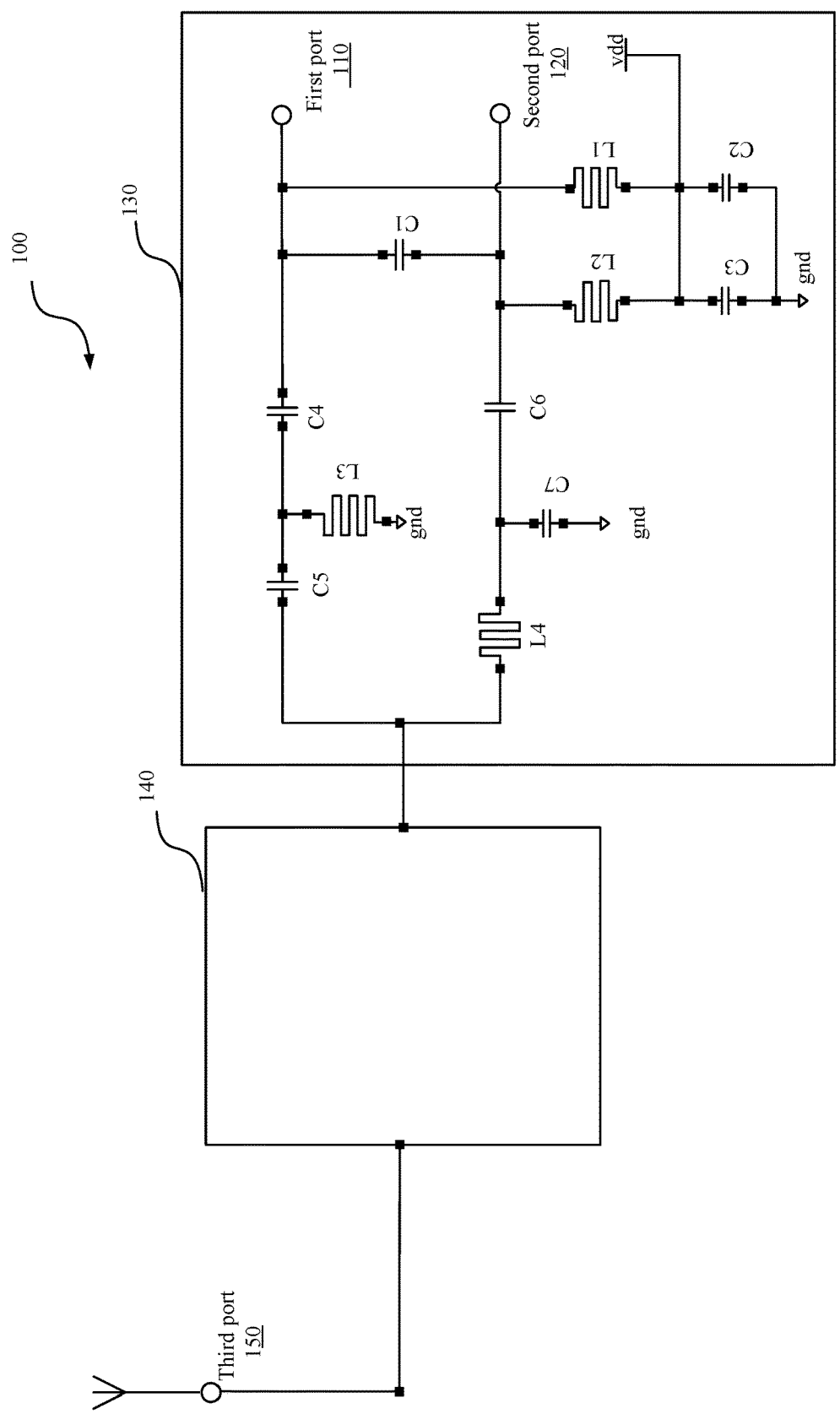
FIG. 2 is a diagram illustrating a more detailed description of the RF circuit shown in FIG. 1.

FIG. 2 is a diagram illustrating a more detailed description of the RF circuit 100 shown in FIG. 1. In the FIG. 2, the radio-frequency matching circuit 130 in the RF circuit 100 further comprises a first capacitor C1, a second capacitor C2, a third capacitor C3, a fourth capacitor C4, a fifth capacitor C5, a sixth capacitor C6 and a seventh capacitor C7, and a first distributed inductor L1, a second distributed inductor L2, a third distributed inductor L3 and a fourth distributed inductor L4.

In the embodiment, the first port 110 is communicatively coupled to the second port 110 via the first capacitor C1. In the radio-frequency matching circuit 130, a first connection point among one end of the first capacitor C1, one end of the fourth capacitor C4 and the first port 110 is communicatively coupled to one end of the first distributed inductor L1. The other end of the first distributed inductor L1 is communicatively coupled to one end of the second capacitor C2. A second connection point among the other end of the first capacitor C1, one end of the sixth capacitor C6 and the second port 220 is communicatively coupled to one end of the second distributed inductor L2. The other end of the second distributed inductor L2 is communicatively coupled to one end of the third capacitor C3. A third connection point between the other end of the second distributed inductor L2 and one end of the third capacitor C3 is communicatively coupled to a fourth connection point between the other end of the first distributed inductor L1 and one end of the second capacitor C2. The fourth connection point is communicatively coupled to the voltage source. A fifth connection point between the other end of the third capacitor C3 and the other end of the second capacitor C2 is communicatively coupled to the ground. Furthermore, a connection point between the other end of the fourth capacitor C4 and one end of the fifth capacitor C5 is communicatively coupled to the ground via a third distributed inductor L3. A connection point between the other end of the sixth capacitor C6 and one end of the fourth distributed inductor L4 is communicatively coupled to the ground via the seventh capacitor C7.

In the embodiment, all of the distributed inductors L1-L4 have a length of microstrip line, wherein the length of microstrip line for manufacturing the first distributed inductor L1 or the second distributed inductor L2 is calculated according to $$\text{Length} = \frac{\left(\frac{X_L}{100}\arctan\right)}{360} \times \lambda$$

and the length of microstrip line for manufacturing the third distributed inductor L3 or the fourth distributed inductor L4 is calculated according to $$\text{Length} = \frac{\left(\frac{X_L}{100}\arcsin\right)}{360} \times \lambda,$$

and wherein the $X_L$ is a inductive reactance value of each distributed inductor and $X_L = 2\pi f\, L$, and wherein $\lambda$ is a transmission wavelength value of signal transmitted in the microstrip line and $\lambda = V_p \times \lambda_{VAC}$, and wherein the L is a inductance value of each distributed inductor and a value range of L is 1 nH-68 nH, and wherein $V_p$ is a transmission speed value of signal transmitted in the microstrip line and $\lambda_{VAC}$ is a transmission wavelength value of signal transmitted in vacuum. For example, L takes a value of 3.3 nH, f takes a value of 1.9 GHz, and the effective dielectric constant for the microstrip line is $E_{EFF} = 3.01$. Accordingly, $X_L = 2\pi f\, L = 39.4$ ohm, $$Vp = \frac{1}{\sqrt{E_{EFF}}} = 0.576,$$

$\lambda_{VAC} = 11800/f = 6210.5$ mil, and $\lambda = V_p \times \lambda_{VAC} = 3577.26$ mil, and thus the length of L1 or L2 is $$\text{Length} = \frac{\left(\frac{X_L}{100}\arctan\right)}{360} \times \lambda = 180.71 \text{ mil}$$

and the length of L3 or L4 is $$\text{Length} = \frac{\left(\frac{X_L}{100}\arcsin\right)}{360} \times \lambda == 190.55 \text{ mil.}$$

Figure 3:
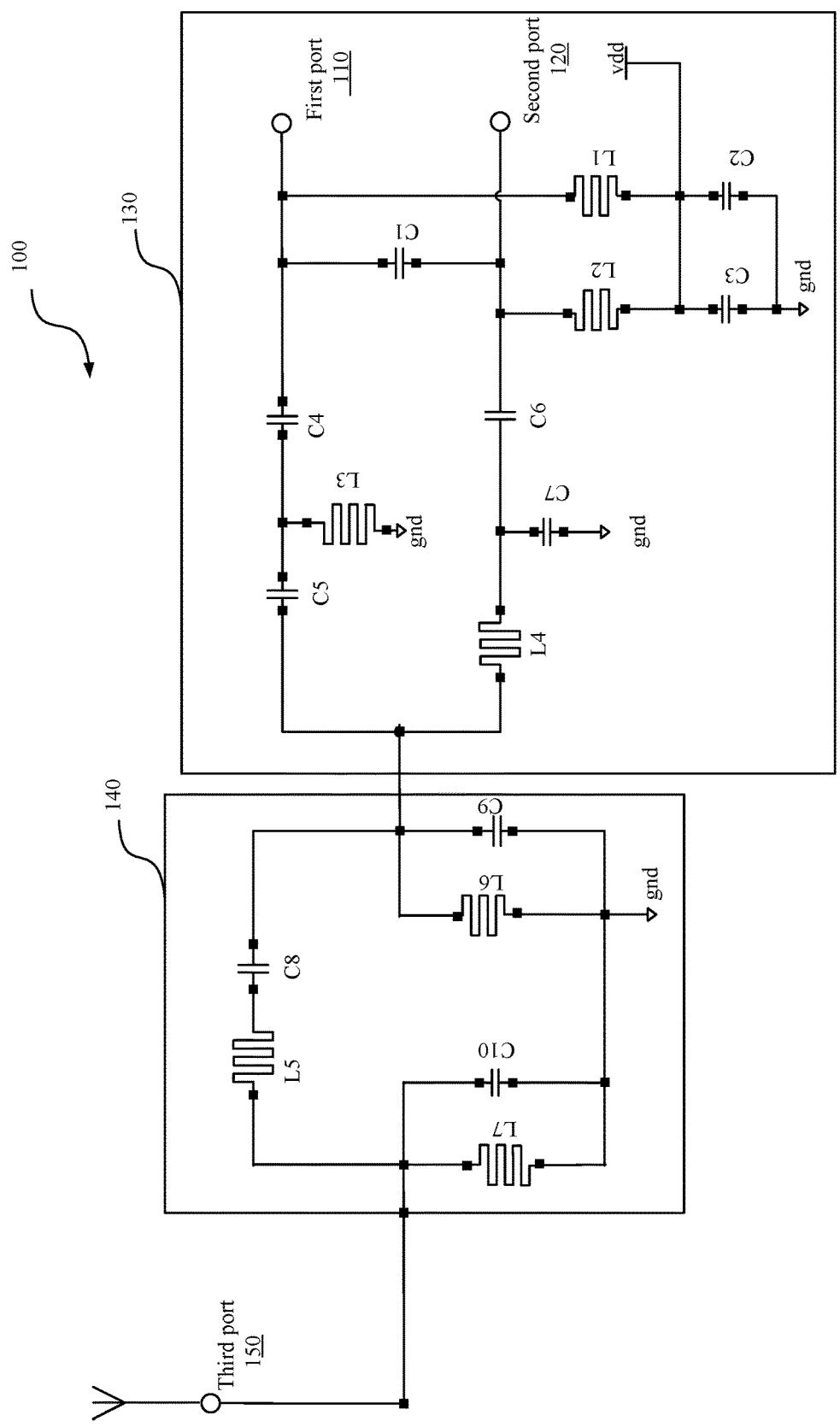
FIG. 3 is a diagram illustrating a further more detailed description of the RF circuit shown in FIG. 1.

FIG. 3 is a diagram illustrating a further more detailed description of the RF circuit 100 shown in FIG. 1. In the FIG. 3, the radio-frequency matching 130 comprise similar elements as the elements described in the radio-frequency matching circuit 130 in FIG. 2, and the connection relationships among these elements are similar to that of FIG. 2, and details are omitted for elements already described with respect to FIG. 2. To be more specific, the band pass filter circuit 340 in the circuit 300 further comprises an eighth capacitor C8, a ninth capacitor C9 and a tenth capacitor C10, and a fifth distributed inductor L5, a sixth distributed inductor L6 and a seventh distributed inductor L7.

In the embodiment, a connection point between the other end of the fifth capacitor C5 and the other end of the fourth distributed inductor L4 in the radio-frequency matching circuit 130 is communicatively coupled to a sixth connection point. The sixth connection point is among one end of the eighth capacitor C8, one end of the sixth distributed inductor L6 and one end of the ninth capacitor C9 in the band pass filter circuit 140. Further, in the band pass filter circuit 140, a seventh connection point between the other end of the sixth distributed inductor L6 and the other end of the ninth capacitor C9 is communicatively coupled to an eighth connection point between one end of the seventh distributed inductor L7 and the other end of the tenth capacitor C10. The seventh connection point and the eighth connection point are connected to the ground. The other end of the eighth capacitor C8 is communicatively coupled to the other end of the fifth distributed inductor L5. The other end of the seventh distributed inductor L7, the other end of the tenth capacitor C10 and one end of the fifth distributed inductor L5 are communicatively coupled to each other at a ninth connection point thereamong.

In the embodiment, all of the distributed inductors L5-L7 have a length of microstrip line, wherein the length of microstrip line for manufacturing the fifth distributed inductor L5, the sixth distributed inductor L6 or the seventh distributed inductor L7 is calculated according to $$\text{Length} = \frac{\left(\frac{X_L}{100}\arctan\right)}{360} \times \lambda,$$

and wherein the $X_L$ is a inductive reactance value of each distributed inductor and $X_L = 2\pi f\, L$, and wherein $\lambda$ is a transmission wavelength value of signal transmitted in the microstrip line and $\lambda = V_p \times \lambda_{VAC}$, and wherein the L is a inductance value of each distributed inductor and a value range of L is 1 nH-68 nH, and wherein $V_p$ is a transmission speed value of signal transmitted in the microstrip line and $\lambda_{VAC}$ is a transmission wavelength value of signal transmitted in vacuum. For example, L takes a value of 3.3 nH, f takes a value of 1.9 GHz, and the effective dielectric constant for the microstrip line is $E_{EFF}$=3.01. Accordingly, $X_L = 2\pi f\, L = 39.4$ ohm, $$Vp = \frac{1}{\sqrt{E_{EFF}}} = 0.576,$$

$\lambda_{VAC}$=11800/f=6210.5 mil, and $\lambda = V_p \times \lambda_{VAC}$=3577.26 mil, and thus the length of L5, L6 or L7 is $$\text{Length} = \frac{\left(\frac{X_L}{100}\arctan\right)}{360} \times \lambda = 180.71 \text{ mil}.$$

Figure 4:
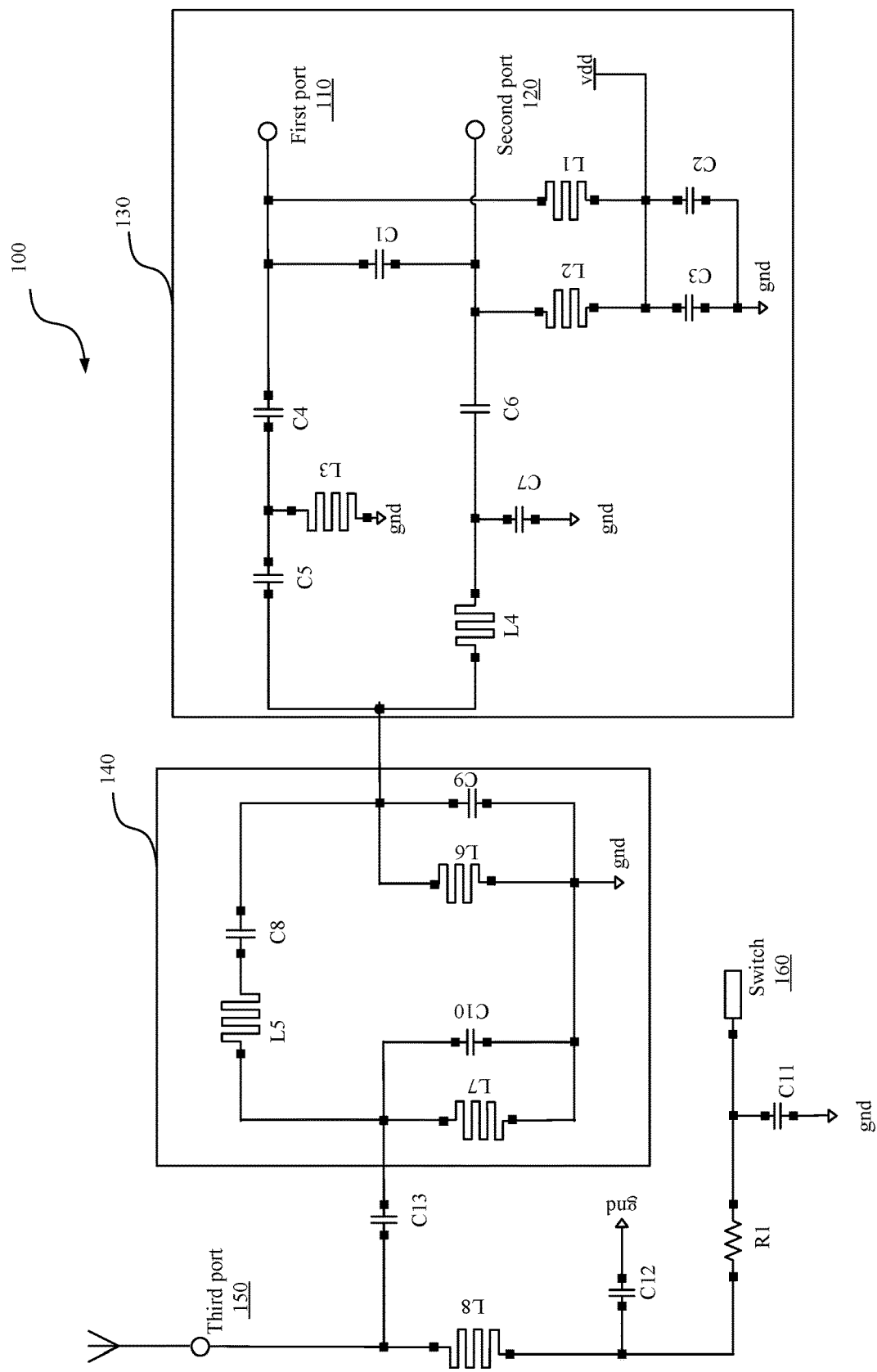
FIG. 4 is a diagram illustrating a still further more detailed description of the RF circuit shown in FIG. 1.

FIG. 4 is a diagram illustrating a still further more detailed description of the RF circuit 100 shown in FIG. 1. In the FIG. 4, the radio-frequency matching 130 and the band pass filter circuit 140 comprise similar elements as the elements described in the radio-frequency matching 130 in FIG. 2 and the band pass filter circuit 140 in FIG. 3, and the connection relationships among these elements are similar to that of FIG. 2 and FIG. 3, and details are omitted for elements already described with respect to FIG. 2 and FIG. 3.

In one embodiment, the RF circuit 100 further comprises a switch 160 communicatively coupled to the third port 150 via an eighth distributed inductor L8 and a first resistor RI and configured to control the third port 150 to output the filtered radio-frequency signal, wherein a connection point between the switch 160 and the first resistor RI is communicatively coupled to the ground via a eleventh capacitor C11, and wherein a connection point between the first resistor RI and the eighth distributed inductor L8 is communicatively coupled to the ground via a twelfth capacitor C12, and wherein the ninth connection point is communicatively coupled to a connection point between the third port 150 and the eighth distributed inductor L8 via a thirteenth capacitor C13. In the embodiment, the filtered RF signal from the band pass filter circuit 140 is outputted via the third port 150 and then transmitted by the antenna communicatively coupled to the third port 150 as shown in the FIG. 4.

In the embodiment, the distributed inductor L8 has a length of microstrip line, wherein the length of microstrip line for manufacturing the fifth distributed inductor L8 is calculated according to $$\text{Length} = \frac{\left(\frac{X_L}{100}\arcsin\right)}{360} \times \lambda,$$

and wherein the $X_L$ is a inductive reactance value of each distributed inductor and $X_L = 2\pi f\, L$, and wherein $\lambda$ is a transmission wavelength value of signal transmitted in the microstrip line and $\lambda = V_p \times \lambda_{VAC}$, and wherein the L is a inductance value of each distributed inductor and a value range of L is 1 nH-68 nH, and wherein $V_p$ is a transmission speed value of signal transmitted in the microstrip line and $\lambda_{VAC}$ is a transmission wavelength value of signal transmitted in vacuum. For example, L takes a value of 3.3 nH, f takes a value of 1.9 GHz, and the effective dielectric constant for the microstrip line is $E_{EFF}$=3.01. Accordingly, $X_L = 2\pi f\, L = 39.4$ ohm, $$Vp = \frac{1}{\sqrt{E_{EFF}}} = 0.576,$$

$\lambda_{VAC}$=11800/f=6210.5 mil, and $\lambda = V_p \times \lambda_{VAC}$=3577.26 mil, and thus the length of L8 is $$\text{Length} = \frac{\left(\frac{X_L}{100}\arcsin\right)}{360} \times \lambda == 190.55 \text{ mil}.$$

Since the distributed inductors in the RF circuit are manufactured by arranging the microstrip lines on the printed circuit board (PCB) directly, the manufacturing cost of the distributed inductors are much cheaper than that of the discrete inductors. Further, the inductance value error of the distributed inductors is much smaller than that of the discrete inductors, thus the consistency of the product performance of the PCB can be improved remarkably.

Figure 5:
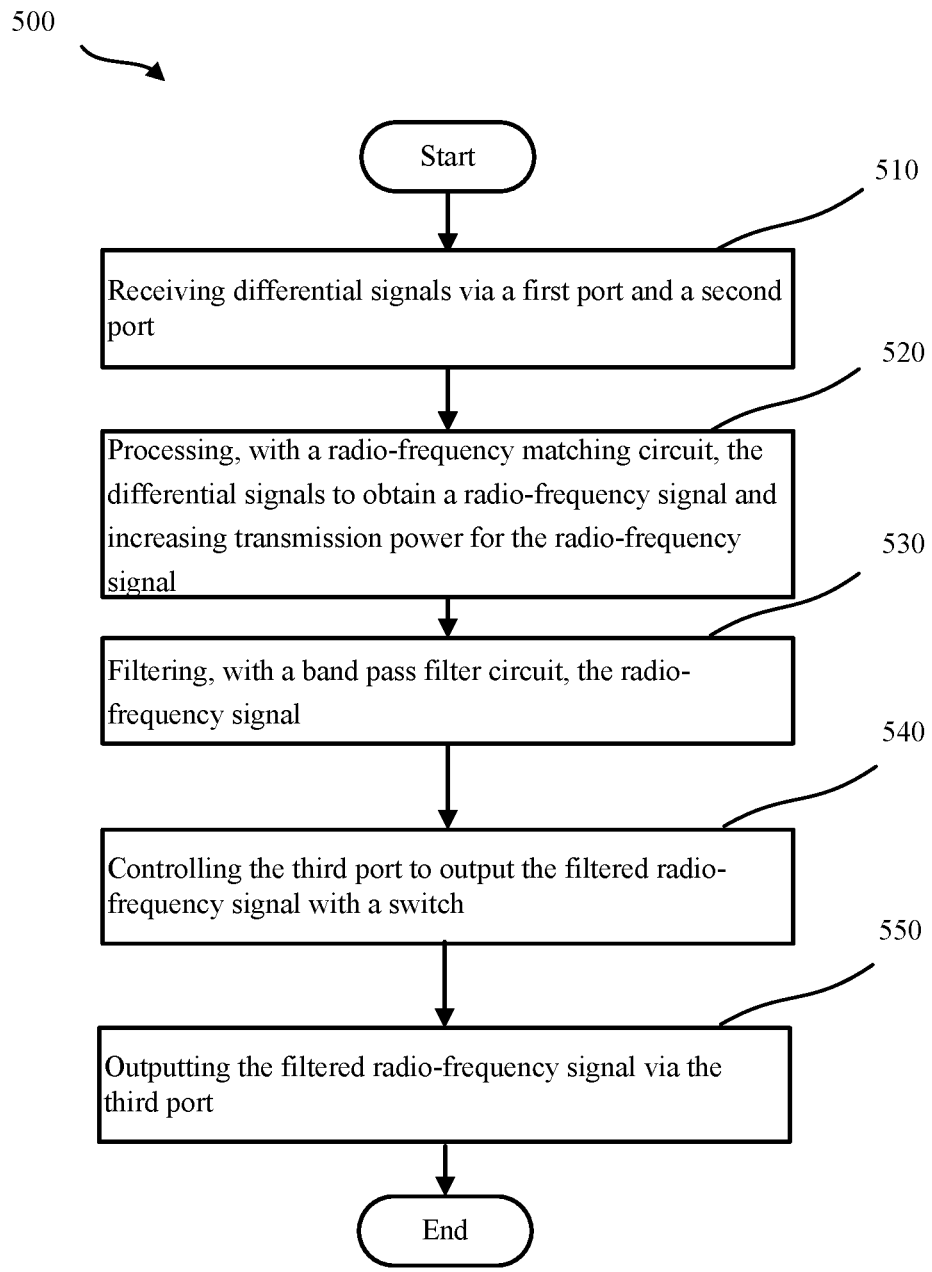
FIG. 5 is a flow chart of a method for receiving and transmitting signal by the RF circuit.

FIG. 5 is a flow chart of a method 500 for receiving and transmitting signal by a RF circuit, for example, the RF circuit 100 shown in FIG. 4. The method 500 comprises receiving (in block 510) a pair of differential signals via a first port 210, 310 or 410 and a second port 220, 320 or 420 and processing (in block 520), with a radio-frequency matching circuit 230, 330 or 430, the pair of differential signals to obtain a radio-frequency signal and increasing transmission power for the radio-frequency signal. The radio-frequency matching circuit 230, 330 or 430 is communicatively coupled to the first port 210, 310 or 410 and the second port 220, 320 or 420. In an embodiment, the radio-frequency matching circuit 230, 330 or 430 includes a first capacitor C1, a second capacitor C2, a third capacitor C3, a fourth capacitor C4, a fifth capacitor C5, a sixth capacitor C6 and a seventh capacitor C7, and a first distributed inductor L1, a second distributed inductor L2, a third distributed inductor L3 and a fourth distributed inductor L4. The connection relationships among these elements are similar to that of FIG. 2, and details are omitted for elements already described with respect to FIG. 2. The method 500 further comprises filtering (in block 530), with a band pass filter circuit 240, 340 or 440, the radio-frequency signal, wherein the band pass filter circuit 240, 340 or 440 is communicatively coupled to the radio-frequency matching circuit 230, 330 or 430. In the embodiment, the band pass filter circuit 240, 340 or 440 includes an eighth capacitor C8, a ninth capacitor C9 and a tenth capacitor C10, and a fifth distributed inductor L5, a sixth distributed inductor L6 and a seventh distributed inductor L7. The connection relationships among these elements are similar to that of FIG. 3, and details are omitted for elements already described with respect to FIG. 3. The method 500 further comprises outputting (in block 550) the filtered radio-frequency signal via a third port 250, 350 or 450, wherein the third port 250, 350 or 450 is communicatively coupled to the band pass filter circuit 240, 340 or 440, and wherein all of the distributed inductors L1-L7 have a length of microstrip line.

In one embodiment, the method 500 further comprises controlling (in block 540) the third port 250, 350 or 450 to output the filtered radio-frequency signal with the switch 460, wherein the switch 460 is communicatively coupled to the third port 450 via an eighth distributed inductor L8 and a first resistor R1, and wherein the eighth distributed inductor L8 has a length of microstrip line.

In the embodiment, all of the distributed inductors L1-L8 have a length of microstrip line, wherein the length of microstrip line for manufacturing the first distributed inductor L1, the second distributed inductor L2, the fifth distributed inductor L5, the sixth distributed inductor L6 or the seventh distributed inductor L7 is calculated according to $$\text{Length} = \frac{\left(\frac{X_L}{100}\arctan\right)}{360} \times \lambda$$

and the length of microstrip line for manufacturing the third distributed inductor L3, the fourth distributed inductor L4 or the eighth inductor L8 is calculated according to $$\text{Length} = \frac{\left(\frac{X_L}{100}\arcsin\right)}{360} \times \lambda,$$

and wherein the $X_L$ is a inductive reactance value of each distributed inductor and $X_L=2\pi f\ L$, and wherein $\lambda$ is a transmission wavelength value of signal transmitted in the microstrip line and $\lambda=V_p \times \lambda_{VAC}$, and wherein the L is a inductance value of each distributed inductor and a value range of L is 1 nH-68 nH, and wherein $V_p$ is a transmission speed value of signal transmitted in the microstrip line and $\lambda_{VAC}$ is a transmission wavelength value of signal transmitted in vacuum. For example, L takes a value of 3.3 nH, f takes a value of 1.9 GHz, and the effective dielectric constant for the microstrip line is $E_{EFF}=3.01$. Accordingly, $X_L=2\pi f\ L=39.4$ ohm, $$Vp = \frac{1}{\sqrt{E_{EFF}}} = 0.576,$$

$\lambda_{VAC}=11800/f=6210.5$ mil, and $\lambda=V_p \times \lambda_{VAC}=35770.26$ mil, and thus the length of L1 or L2 is $$\text{Length} = \frac{\left(\frac{X_L}{100}\arctan\right)}{360} \times \lambda = 180.71\ \text{mil}$$

and the length of L3 or L4 is $$\text{Length} = \frac{\left(\frac{X_L}{100}\arcsin\right)}{360} \times \lambda == 190.55\ \text{mil}.$$

Since the distributed inductors in the RF circuit are manufactured by arranging the microstip lines on the printed circuit board (PCB) directly, the manufacturing cost of the distributed inductors are much cheaper than that of the discrete inductors. Further, the inductance value error of the distributed inductors is much smaller than that of the discrete inductors, thus the consistency of the product performance of the PCB can be improved remarkably.

It should be appreciated by those ordinary skill in the art that components from different embodiments may be combined to yield another technical solution. This written description uses examples to disclose the invention, including the best mode, and also to enable any person ordinary skill in the art to practice the invention, including making and using any devices or systems and performing any incorporated methods. The patentable scope of the invention is defined by the claims, and may include other examples that occur to those ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A radio-frequency transceiver circuit, comprising:
a first port and a second port, configured to, together, receive a pair of differential signals;
a radio-frequency matching circuit, communicatively coupled to the first port and the second port, and configured to process the pair of differential signals to obtain a radio-frequency signal and increase transmission power for the radio-frequency signal, wherein the radio-frequency matching circuit includes at least one capacitor and at least one distributed inductor;
a band pass filter circuit, communicatively coupled to the radio-frequency matching circuit and configured to filter the radio-frequency signal, wherein the band pass filter circuit includes at least one capacitor and at least one distributed inductor; and
a third port, communicatively coupled to the band pass filter circuit and configured to output the filtered radio-frequency signal,
wherein both of the at least one distributed inductors have a length of microstrip line;
wherein the radio-frequency matching circuit further comprises a first distributed inductor, a second distributed inductor, a third distributed inductor, an fourth distributed inductor, a first capacitor, an second capacitor, a third capacitor, a fourth capacitor, an fifth capacitor, a sixth capacitor, a seventh capacitor, and a voltage source,
wherein the first port is communicatively connected to the second port via the first capacitor;
wherein a first connection point among one end of the first capacitor, one end of the fourth capacitor and the first port is communicatively coupled to one end of the first distributed inductor, and the other end of the first distributed inductor is communicatively coupled to one end of the second capacitor;
wherein a second connection point among the other end of the first capacitor, one end of the sixth capacitor and the second port is communicatively coupled to one end of the second distributed inductor and the other end of the second distributed inductor is communicatively coupled to one end of the third capacitor;
wherein a third connection point between the other end of the second distributed inductor and one end of the third capacitor is communicatively coupled to a fourth connection point between the other end of the first distributed inductor and one end of the second capacitor, and the other end of the third capacitor is communicatively coupled to the other end of the second capacitor at a fifth connection point, and wherein the fourth connection point is communicatively coupled to the voltage source and the fifth connection point is communicatively coupled to the ground;
wherein a connection point between the other end of the fourth capacitor and one end of the fifth capacitor is communicatively coupled to the ground via a third distributed inductor; and
wherein a connection point between the other end of the sixth capacitor and one end of the fourth distributed inductor is communicatively coupled to the ground via the seventh capacitor.

2. The radio-frequency transceiver circuit of claim 1, wherein
the band pass filter circuit further comprises a fifth distributed inductor, a sixth distributed inductor, a seventh distributed inductor, an eighth capacitor, a ninth capacitor and a tenth capacitor, and
wherein a sixth connection point among one end of the eighth capacitor, one end of the sixth distributed inductor and one end of the ninth capacitor is communicatively coupled to a connection point between the other end of the fifth capacitor and the other end of the fourth distributed inductor;
wherein a seventh connection point between the other end of the sixth distributed inductor and the other end of the ninth capacitor is communicatively coupled to an eighth connection point between one end of the seventh distributed inductor and the other end of the tenth capacitor, and wherein both the seventh connection point and the eighth connection point are connected to the ground;
wherein the other end of the eighth capacitor is communicatively coupled to the other end of the fifth distributed inductor; and
wherein the other end of the seventh distributed inductor, the other end of the tenth capacitor and one end of the fifth distributed inductor are communicatively coupled to each other at a ninth connection point thereamong.

3. The radio-frequency transceiver circuit of claim 2, further comprises a switch communicatively coupled to the third port via an eighth distributed inductor and a first resistor and configured to control the third port to output the filtered radio-frequency signal, wherein a connection point between the switch and the first resistor is communicatively coupled to the ground via a eleventh capacitor, and wherein a connection point between the first resistor and the eighth distributed inductor is communicatively coupled to the ground via a twelfth capacitor, and wherein the ninth connection point is communicatively coupled to a connection point between the third port and the eighth distributed inductor via a thirteenth capacitor.

4. The radio-frequency transceiver circuit of claim 3, wherein the length of microstrip line for manufacturing the eighth distributed inductor, the fourth distributed inductor, or the third distributed inductor is calculated according to Length=(Insert formula here)×λ and wherein the length of microstrip line for manufacturing the fifth distributed inductor, the sixth distributed inductor, the seventh distributed inductor, the second distributed inductor or the first distributed inductor is calculated according to Length=(Insert formula here)×λ, wherein the $X_L$ is a inductive reactance value of each distributed inductor and $X_L=2\pi f L$, and wherein λ is a transmission wavelength value of signal transmitted in the microstrip line and $\lambda=V_P \times \lambda_{VAC}$, and wherein the L is a inductance value of each distributed inductor and a value range of L is 1 nH-68 nH, and wherein $V_P$ is a transmission speed value of signal transmitted in the microstrip line and $\lambda_{VAC}$ is a transmission wavelength value of signal transmitted in vacuum.

5. A method, comprising:
receiving a pair of differential signals via a first port and a second port;
processing, with a radio-frequency matching circuit, the pair of differential signals to obtain a radio-frequency signal and increasing transmission power for the radio-frequency signal, wherein the radio-frequency matching circuit is communicatively coupled to the first port and the second port and includes at least one capacitor and at least one distributed inductor;
filtering, with a band pass filter circuit, the radio-frequency signal, wherein the band pass filter circuit is communicatively coupled to the radio-frequency matching circuit and includes at least one capacitor and at least one distributed inductor; and
outputting the filtered radio-frequency signal via a third port, wherein the third port is communicatively coupled to the band pass filter circuit, and
wherein both of the at least one distributed inductors have a length of microstrip line;
wherein the radio-frequency matching circuit further comprises a first distributed inductor, a second distributed inductor, a third distributed inductor, an fourth distributed inductor, a first capacitor, an second capacitor, a third capacitor, a fourth capacitor, an fifth capacitor, a sixth capacitor, a seventh capacitor, and a voltage source,
wherein the first port is communicatively connected to the second port via the first capacitor;
wherein a first connection point among one end of the first capacitor, one end of the fourth capacitor and the first port is communicatively coupled to one end of the first distributed inductor, and the other end of the first distributed inductor is communicatively coupled to one end of the second capacitor;
wherein a second connection point among the other end of the first capacitor, one end of the sixth capacitor and the second port is communicatively coupled to one end of the second distributed inductor and the other end of the second distributed inductor is communicatively coupled to one end of the third capacitor;
wherein a third connection point between the other end of the second distributed inductor and one end of the third capacitor is communicatively coupled to a fourth connection point between the other end of the first distributed inductor and one end of the second capacitor, and the other end of the third capacitor is communicatively coupled to the other end of the second capacitor at a fifth connection point, and wherein the fourth connection point is communicatively coupled to the voltage source and the fifth connection point is communicatively coupled to the ground;
wherein a connection point between the other end of the fourth capacitor and one end of the fifth capacitor is communicatively coupled to the ground via a third distributed inductor; and
wherein a connection point between the other end of the sixth capacitor and one end of the fourth distributed inductor is communicatively coupled to the ground via the seventh capacitor.

6. The method of claim 5, wherein
the band pass filter circuit further comprises a fifth distributed inductor, a sixth distributed inductor, a seventh distributed inductor, an eighth capacitor, a ninth capacitor and a tenth capacitor, and wherein a sixth connection point among one end of the eighth capacitor, one end of the sixth distributed inductor and one end of the ninth capacitor is communicatively coupled to a connection point between the other end of the fifth capacitor and the other end of the fourth distributed inductor;

wherein a seventh connection point between the other end of the sixth distributed inductor and the other end of the ninth capacitor is communicatively coupled to an eighth connection point between one end of the seventh distributed inductor and the other end of the tenth capacitor, and wherein both the seventh connection point and the eighth connection point are connected to the ground;

wherein the other end of the eighth capacitor is communicatively coupled to the other end of the fifth distributed inductor; and wherein the other end of the seventh distributed inductor, the other end of the tenth capacitor and one end of the fifth distributed inductor are communicatively coupled to each other at a ninth connection point thereamong.

7. The method of claim 6, further comprises controlling the third port to output the filtered radio-frequency signal with a switch, wherein the switch is communicatively coupled to the third port via an eighth distributed inductor and a first resistor and configured to control the third port to output the filtered radio-frequency signal, wherein a connection point between the switch and the first resistor is communicatively coupled to the ground via a eleventh capacitor, and wherein a connection point between the first resistor and the eighth distributed inductor is communicatively coupled to the ground via a twelfth capacitor, and wherein the ninth connection point is communicatively coupled to a connection point between the third port and the eight distributed inductor via a thirteenth capacitor.

8. The method of claim 7, wherein the length of microstrip line for manufacturing the eighth distributed inductor, the fourth distributed inductor, or the third distributed inductor is calculated according to Length=(Insert formula here)×λ, and wherein the length of microstrip line for manufacturing the fifth distributed inductor, the sixth distributed inductor, the seventh distributed inductor, the second distributed inductor or the first distributed inductor is calculated according to Length=(Insert formula here)× λ, wherein the $X_L$ is a inductive reactance value of each distributed inductor and $X_L=2\pi f L$, and wherein λ is a transmission wavelength value of signal transmitted in the microstrip line and $\lambda=V_P \times \lambda_{VAC}$, and wherein the L is a inductance value of each distributed inductor and a value range of L is 1 nH-68 nH, and wherein $V_P$ is a transmission speed value of signal transmitted in the microstrip line and $\lambda_{VAC}$ is a transmission wavelength value of signal transmitted in vacuum.

\* \* \* \* \*